(12) United States Patent
Ju et al.

(10) Patent No.: US 6,461,785 B1
(45) Date of Patent: Oct. 8, 2002

(54) COMPOSITION FOR POSITIVE PHOTORESIST

(75) Inventors: Jin-Ho Ju, Seoul (KR); Yu-Kyung Lee, Yongin (KR); Hong-Sik Park, Yongin (KR); Yun-Jung Nah, Suwon (KR); Ki-Soo Kim, Anyang (KR); Sung-Chul Kang, Seongnam (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/651,114

(22) Filed: Aug. 30, 2000

(30) Foreign Application Priority Data

Aug. 30, 1999 (KR) .............................. 99-36320

(51) Int. Cl.⁷ .............................. G03F 7/023
(52) U.S. Cl. .................. 430/191; 430/192; 430/193; 430/270.1
(58) Field of Search ................. 430/191, 192, 430/193, 270.1

(56) References Cited

U.S. PATENT DOCUMENTS

| | | | | | |
|---|---|---|---|---|---|
| 5,679,495 A | * | 10/1997 | Yamachika et al. | ......... | 430/191 |
| 5,849,457 A | * | 12/1998 | Namba et al. | .............. | 430/191 |
| 6,048,659 A | * | 4/2000 | Inoue et al. | ................ | 430/191 |
| 6,338,930 B1 | * | 1/2002 | Ju et al. | ..................... | 427/123 |

* cited by examiner

Primary Examiner—John S. Chu
(74) Attorney, Agent, or Firm—McGuireWoods LLP; Hae-Chan Park

(57) ABSTRACT

A photoresist composition is provided. The photoresist composition includes a polymer resin for forming a photoresist layer, a photosensitive chemical for changing solubility of the photoresist layer when exposed to some form of radiation, and 3-methoxybutyl acetate, 2-heptanone, and 4-butyrolactone as a solvent. The composition has a good photosensitivity and remainder ratio, and no unpleasant odor.

3 Claims, No Drawings

COMPOSITION FOR POSITIVE PHOTORESIST

BACKGROUND OF THE INVENTION (a) Field of the Invention

The present invention relates to a composition for a positive type photoresist for manufacturing microscopic circuit patterns such as liquid crystal display circuits or semiconductor integrated circuits and, more particularly, to a composition for a positive type photoresist, including polymer resin that produces a photoresist layer, photosensitive chemical and solvents.

(b) Description of the Related Art

For producing tiny circuit patterns such as those used in liquid crystal display (LCD) circuits or semiconductor integrated circuits, a photoresist composition is uniformly coated or applied on an insulator layer or a conductive metal layer on a substrate. The coated or applied substrate is then exposed through a mask to some form of radiation, such as ultraviolet light, electrons, or X-rays. And the exposed substrate is developed to produce a desired pattern. The patterned photoresist film is used as a mask to remove the insulator layer or the conductive metal layer. Then the remaining photoresist layer is removed to complete the microscopic circuit pattern onto the substrate surface. Photoresist compositions are classified into negative and positive types depending on whether the exposed areas of photoresist coating become insoluble or soluble. Recently, positive type photoresist compositions have been preferred, because they can form firmer patterns.

The important properties of photoresist compositions for commercial use are photosensitivities, contrast, resolution, adhesivity to the substrate, remainder ratio, and safety.

Photosensitivity refers to the speed how fast the photoresist responds to the light. Higher photosensitivity is required, particularly in applications where a number of exposures are performed to form multiple patterns by a repeated process. The other examples are when reduced light is used, like the projection exposure techniques that use light passed through a series of lenses and mono-chromatic filters.

Contrast refers to a ratio between the percentage of film loss in the exposed development area and the percentage of film loss on the unexposed area. Ordinarily, development of an exposed resist coated substrate is continued until the coating on the exposed area is completely dissolved away. Thus, development contrast can be determined simply by measuring the percentage of the film coating loss in the unexposed areas when the exposed coating areas are removed entirely.

Resolution refers to the capability of a photoresist composition how finely to reproduce the mask image utilized during exposure on the developed exposed spaces. In many industrial applications, particularly in the manufacture of LCDs or semiconductor integrated circuits, a photoresist is required to provide a high degree of resolution for very fine line and space widths of 1 $\mu$ or less.

Generally, photoresist composition includes a polymer resin for producing a photoresist layer, photosensitive chemicals, and a solvent. Various attempts have been made previously to improve the photosensitivity, contrast, resolution, and the safety of positive photoresist compositions. For example, U.S. Pat. No. 3,666,473 discloses the compound of a mixture of two phenol formaldehyde novolak resins together with a typical photosensitive chemical. U.S. Pat. No. 4,115,128 discloses that an organic acid cyclic anhydride was added to the phenolic resin and naphthoquinone diazide photosensitive chemical to increase photosensitivity. U.S. Pat. No. 4,555,069 discloses that novolak resin and o-quninone diazide photosensitive chemical and propylene glycol alkyl ether acetate solvent are used for higher photosensitivity and for increased safety.

Various solvents have been developed to improve physical properties of the photoresist composition and work safety. For example, ethylene glycol mono ethyl ether acetate or ethyl lactate, propylene glycol mono ethyl ether acetate may be used as solvent. However, the photoresist composition including ethyl lactate exhibits poor adhesivity to the substrate and it is difficult to be coated on a substrate uniformly. Ethylene glycol mono ethyl ether acetate or propylene glycol mono ethyl ether acetate is toxic and generates an unpleasant odor during the process. Accordingly, there is still a need for photoresist compositions that are suitable for various industrial applications, without sacrificing any one of the properties of photosensitivity, contrast, resolution, or solubility of polymer resin.

SUMMARY OF THE INVENTION

It is an object of the present invention to provide a composition for a positive type photoresist that exhibits high photosensitivity, remainder ratio, contrast, resolution, and substrate adhesivity for varieties of industrial applications.

It is another object to provide a composition for a positive type photoresist that is safe, without unpleasant odor, and environmentally friendly.

These and other objects may be achieved by a composition for positive type photoresist of the present invention. This composition includes a polymer resin for forming a photoresist layer, a photosensitive chemical that changes solubility of the photoresist layer when exposed to some form of radiation, and a solvent of 3-methoxybutyl acetate, 2-heptanone, and 4-butyrolactone. The polymer resin is preferably a novolak resin and the photosensitive chemical is preferably a diazide-type compound. The ratio of 3-methoxybutylacetate:2-heptanone:4-butyrolactone is 50 to 70 parts by weight 3-methoxybutylacetate to 5 to 15 parts by weight 2-heptanone to 2 to 10 parts by weight 4-butyrolactone.

DETAILED DESCRIPTION OF THE INVENTION

The useful polymer resins employed in a photoresist composition of the present invention are well known in the related arts. A novolak resin, an exemplary polymer resin, may be employed in a photoresist composition of the present invention. The novolak resin is produced by reacting aromatic alcohol such as phenol, meta and/or para cresol with formaldehyde. To improve the photoresist, the molecular weight of the resin may be controlled by adjusting the ratio among high, medium or low molecular resins depending on the purpose of the photoresist.

The useful diazide compound for a photosensitive chemical may be produced by reacting polyhydroxy benzophenone with a diazide-based compound such as 1,2-naphtoquinonediazide, or 2-diazide-1-naphtol-5-sulfonic acid.

The solvent includes 3-methoxybutyl acetate, 2-heptanone and 4-butyrolactone. The ratio of 3-methoxybutyl acetate:2-heptanone:4-butyrolactone is preferably 50 to 70 parts by weight 3-methoxybutyl acetate to 5 to 15 parts by weight 2-heptanone to 2 to 10 parts by weight 4-butyrolactone, and more preferably 55 to 65 parts by weight 3-methoxybutyl acetate to 7 to 13 parts by weight 2-heptanone to 2 to 5 parts by weight 4-butyrolactone.

3-methoxybutyl acetate more than the above range decreases the viscosity of the composition and reduces the thickness of the photoresist layer as well as deteriorate the remainder ratio. On the other hand, 3-methoxybutyl acetate less than the above range increases the viscosity and increases the thickness of the layer too much while reducing. 2-heptanone more than the above range makes, the composition difficult to use because of it's unpleasant odor, and decreases the viscosity of the composition while reducing the thickness of the layer thins. On the other hand, 2-heptanone less than the above range increases the viscosity of the composition too much and reduces the photosensitivity. 4-butyrolactone more than and reduces the above range deteriorate the remainder ratio. 4-butyrolactone less than the above range reduces the solubility of the photosensitive chemical such that the homogeneous composition is not obtained and easily produces particles on the substrate.

In the present invention, the photoresist composition includes preferably about 10 to about 25 wt % of the polymer resin, about 4 to 10 wt % of the photosensitive chemical, and 65 to 85 wt % of the solvent.

If the amount of the polymer resin is less than 10 wt %, the adhesion to substrate is reduced and the produced profile becomes bad. On the other hand, if the amount thereof is more than 25 wt %, the increased viscosity reduces the photosensitivity and the ability to coat the composition. If the amount of the photosensitive chemical is less than 4 wt %, the resolution is reduced and the profile becomes bad. However, the photosensitive chemical more than 10 wt % easily produces scum or particles in coating the photoresist composition on the substrate.

The photoresist composition of the present invention may include such additives as a colorants, dyes, anti-striation agents, plasticizers, adhesion promoters, speed enhancers, and/or surfactants. Such additives help to improve the performance of the photoresist composition.

The photoresist composition of the present invention can be applied to a substrate by such conventional method as dipping, spraying, whirling and spin coating. When spin coating, for example, the photoresist solution can be adjusted in respect to the percentage of solid contents in order to provide a coating of the desired thickness given the type of spinning equipment utilized and the spinning process. Suitable substrates include silicon, aluminum, silicon dioxide, doped silicon dioxide, silicon nitride, tantalum, copper, polysilicon, ceramics, and aluminum/copper mixtures or polymeric resins.

The substrate coated with photoresist composition is heated at 20° C. to 100° C. for soft-baking. This step permits the evaporation of the solvent without pyrolysis of a solid component in the photoresist composition. Generally, the concentration of the solvent is preferably reduced to minimum by the soft-baking step, and thus, the soft-baking step is performed until the solvent is mostly evaporated and a thin coating layer of photoresist thinner than 6 $\mu$ remains on the substrate.

Next, the substrate coated with the photoresist layer is selectively exposed to light, particularly, ultraviolet light using a suitable mask to obtain a desirable pattern. The exposed substrate is then dipped into an aqueous alkaline developing solution until either the exposed photoresist layer is all or almost entirely dissolved. Suitable aqueous developing solutions include an aqueous solution including alkaline hydroxides, ammonium hydroxide, or tetramethylammonium hydroxide (TMAH).

The substrate with the exposed photoresist removed is then taken out from the developing solution. The resulting substrate is heat-treated to improve and to increase the chemical resistance of the photoresist layer. This step is called a hard-baking step. The hard-baking is done at a temperature below the softening point of the photoresist layer, preferably at about 100° C. to 150° C.

The developed substrate is treated with an etchant or with vapor plasma to etch the exposed portion and the remaining photoresist protects the substrate regions which it covers. The photoresist layer is removed from the etched substrate using a stripper to complete the pattern onto the substrate surface.

The following examples further illustrate the present invention.

EXAMPLE 1

A photoresist composition including 6.43 wt % of a photosensitive chemical, 19.47 wt % of a polymer resin, 59.3 wt % of 3-methoxybutyl acetate, 11.1 wt % of 2-heptanone and 3.70 wt % of 4-butylolactone was spin coated to 4 inch bare glass plates. The resulting glass plates were heat-dried at 135° C. for 90 seconds to form a photoresist film layer with a thickness of 1.60$\mu$ on the glass. The resulting glass plates were exposed to ultraviolet light using a mask and then dipped into a 2.38% tetramethyl ammonium hydroxide (TMAH) aqueous solution for 75 seconds to remove the exposed portions and obtain photoresist patterns.

It was found that the photoresist composition had a good photosensitivity. While changing the rotating speed from 950 rpm to 1,400 rpm, soft-baking steps were performed at 90° C. and 135° C. for 90 seconds, respectively. The thicknesses of layer (Tpr, $\mu t$) were measured and the results are presented in Table 1.

TABLE 1

| | 950 rpm | | 1,100 rpm | | 1,250 rpm | | 1,400 rpm | |
| --- | --- | --- | --- | --- | --- | --- | --- | --- |
| | 90° C. | 135° C. | 90° C. | 135° C. | 90° C. | 135° C. | 90° C. | 135° C. |
| Example | 1.635 | 1.508 | 1.590 | 1.463 | 1.531 | 1.407 | 1.461 | 1.348 |

As shown in Table 1, the layers produced by using the photoresist composition of the present invention have thin Tpr thicknesses. Furthermore, since the thickness increases linearly as the spin speed increases layer thickness can be effectively predicted when changing the spin speed.

The positive type photoresist composition of the present invention has good physical properties, such as photosensitivity and Tpr, so that the composition can be easily applied to industrial applications. Furthermore, the composition has no unpleasant odor so that it can contribute to a favorable work environment.

While the present invention has been described in detail with reference to the preferred embodiments, those skilled in the art will appreciate that various modifications and substitutions can be made thereto without departing from the spirit and scope of the present invention as set forth in the appended claims.

What is claimed is:

1. A composition for positive photoresist, comprising:
   a polymer resin for forming a photoresist layer;
   a photosensitive chemical that changes the solubility of the photoresist layer when exposed to some form of radiation; and
   50 to 70 parts by weight of 3-methoxybutyl acetate, 5 to 15 parts by weight of 2-heptanone, and 2 to 10 parts of weight 4-butyrolactone, as a solvent.

2. The composition of claim 1, wherein the polymer resin is a novolak resin and the photosensitive chemical is a diazide-based compound.

3. The composition of claim 1, wherein the photoresist composition includes 10 to 25 wt % of polymer resin, 4 to 10 wt % of photosentive compound, and 65 to 85 wt % of solvent.

* * * * *